United States Patent [19]

Takagi et al.

[11] Patent Number: 5,418,383
[45] Date of Patent: May 23, 1995

[54] SEMICONDUCTOR DEVICE CAPABLE OF PREVIOUSLY EVALUATING CHARACTERISTICS OF POWER OUTPUT ELEMENT

[75] Inventors: Yosuke Takagi, Yokohama; Yu Ohata, Tokyo; Koichi Kitahara, Chino, all of Japan

[73] Assignee: Kabushiki Kaisha Toshiba, Kawasaki, Japan

[21] Appl. No.: 143,060

[22] Filed: Oct. 29, 1993

[30] Foreign Application Priority Data

Oct. 30, 1992 [JP] Japan ................... 4-293254

[51] Int. Cl.⁶ ............ H01L 23/58; H01L 29/76; H01L 29/94; H01L 23/62
[52] U.S. Cl. .................... 257/48; 257/328; 257/337; 257/356; 257/500
[58] Field of Search ................ 257/48, 355, 328, 356, 257/362, 337, 341, 343, 500, 501, 502

[56] References Cited

U.S. PATENT DOCUMENTS 3,585,712 6/1971 Boncuk ................ 257/48
3,999,212 12/1976 Usuda ................ 257/356
4,104,785 8/1978 Shiba et al. ................ 257/48

FOREIGN PATENT DOCUMENTS 0175870 4/1986 European Pat. Off. ............ 257/48
0315213 5/1989 European Pat. Off. ............ 257/328
0336528 10/1989 European Pat. Off. ............ 257/208

OTHER PUBLICATIONS

IBM Technical Disclosure Bulletin, vol. 13, No. 10, pp. 2844, Mar. 1971, P. Evrenidis, et al., "Temporary Elimination of Protective Diode".
Proceedings of the 3rd International Symposium on Power Semiconductor Devices and ICs, pp. 242–247, Apr. 22–24, 1991, T. Fujihira, et al., "Self-Isolation NMOS-DMOS Technology for Automotive Low-Side Switches".

*Primary Examiner*—Steven Ho Yin Loke
*Attorney, Agent, or Firm*—Oblon, Spivak, McClelland, Maier & Neustadt

[57] ABSTRACT

At least one power output element made of an insulated gate semiconductor element, a surge protection element for an input electrode of the power output element, and a circuit element block for controlling the power output element, are formed on the same semiconductor substrate. A predetermined electrode of the power output element and one end of the surge protection element are connected to each other. In this state, first, second, and third electrode wiring layers are connected to an output terminal of the circuit element block, the other end of the surge protection element, and the input electrode of the power output element, respectively, and the first to third electrode wiring layers are formed separately from one another. In order to connect the first to third electrode wiring layers to each other, a fourth electrode wiring layer is formed thereon. Thus, a characteristic of the power output element is previously evaluated before the fourth electrode wiring layer is formed, using at least the third electrode wiring layer.

9 Claims, 3 Drawing Sheets

SEMICONDUCTOR DEVICE CAPABLE OF PREVIOUSLY EVALUATING CHARACTERISTICS OF POWER OUTPUT ELEMENT

BACKGROUND OF THE INVENTION

1. Field of the Invention

The present invention relates to a monolithic semiconductor device including one or plural power output elements and circuit blocks for controlling the power output elements both formed on one chip and a method for manufacturing the same and, more particularly, to a semiconductor device whose gate oxide film is improved in reliability when an insulated gate semiconductor element is used as a power output element and a method for manufacturing the same.

2. Description of the Related Art

In a conventional monolithic semiconductor device wherein one or plural power output elements and circuit blocks for controlling these elements are formed on one chip, all the elements and circuit blocks are electrically connected to one another by metal wiring using aluminum (Al) electrodes and the like so as to serve as a single functional device and, in this state, screening is performed to determine whether the chip is defective or not.

However, in the screening of the chip, it is impossible to sufficiently determine whether the respective power output elements and circuit blocks are defective or not.

For example, as shown in FIG. 3, in a functional device comprising an output element 1 of a power metal oxide silicon FET (power MOSFET), circuit blocks 2, 3 and 4 for controlling the output element 1, and a Zener diode 5 for protecting a gate-to-source path of the output element 1, as shown in FIG. 3, a considerably high voltage has to be applied between the gate and source of the output element 1 in order to evaluate the withstand voltage of a gate oxide film of the output element 1.

However, the Zener diode 5 makes it difficult to apply such a high voltage between the gate and source of the output element 1. This drawback will be described in detail.

Normally, as shown in FIG. 4, the Zener diode 5 has a voltage of 10 V enough to turn on the output element 1 in order to protect the gate-to-source path of the output element 1 from its breakage when a surge voltage higher than a predetermined value is applied between the gate and source of the output element 1.

The gate oxide film of the power MOSFET has a time dependent dielectric breakdown (TDDB) mode in which the gate oxide film is broken in connection with time and temperature when a voltage is applied thereto for a long time, even though the voltage is lower than the breakdown voltage.

FIG. 5 is a graph showing a relationship between a temperature and an estimated lifetime of the gate oxide film for each voltage to be used.

Calculating the lifetime of the gate oxide film by means of the Anolick's model which is widely used as a formula for the TDDB, a voltage of about 20 V has to be applied to the gate oxide film at the time of probe cut in order to secure the lifetime of 15 years when the used voltage is 10 V and the temperature is 90° C.

Therefore, a voltage of 20 V has to be applied to the gate of the output element 1 for chip screening. Since, however, the Zener diode 5 for protecting the gate-to-source path of the output element 1 has a characteristic as shown in FIG. 4, if the voltage of 20 V is applied, an overcurrent of nearly 20 mA flows through the Zener diode 5. The overcurrent causes the Zener diode 5 to be burnt and broken, and adversely affects the characteristic of the functional device.

SUMMARY OF THE INVENTION

The present invention has been developed in consideration of the above situation, and its object is to provide a semiconductor device wherein the characteristics of power MOSFET output elements and circuit blocks connected to the output elements are evaluated before they are connected to serve as a functional device, which was difficult in the conventional semiconductor device, to thereby improve the reliability of a gate oxide film, and a method for manufacturing the semiconductor device.

According to a first aspect of the present invention, there is provided a semiconductor device comprising:

at least one power output element made of an insulated gate semiconductor element, a surge protection element for an input electrode of the power output element, and a circuit element block for controlling for the power output element, the power output element, the surge protection element and the circuit element block being formed on a single semiconductor substrate;

first, second and third electrode wiring layers connected to an output terminal of the circuit element block, the input electrode of the power output element, and one end of the surge protection element, respectively; while the power output element, the surge protection element, and the circuit element block are partially connected to one another and a predetermined electrode of the power output element is connected to another end of the surge protection element, the first, second and third electrode wiring layers being formed separately from one another;

a fourth electrode wiring layer formed on the first, second and third electrode wiring layers, for connecting the first, second and third electrode wiring layers to each other, wherein a characteristic of the power output element is previously evaluated using at least the second electrode wiring layer before the fourth electrode wiring layer is formed.

More specifically, in a monolithic semiconductor device wherein a power MOSFET serving as one or more power output elements, a Zener diode serving as a surge protection element for the power MOSFET, and a circuit block (including an element for protecting a gate-to-source path of the power MOSFET) for controlling the power MOSFET are formed on one chip, the power MOSFET, Zener diode, and circuit block are formed as electrode wiring layers independently of one another, and they are connected to constitute a single functional device after an amount of withstand voltage of the gate of the power MOSFET is confirmed.

According to a second aspect of the present invention, there is provided a semiconductor device comprising:

at least one power output element made of an insulated gate semiconductor element, and a surge protection element for an input electrode of the power output element each formed on a semiconductor substrate;

first and second electrode wiring layers connected to the input electrode of the power output element and one end of the surge protection element, respectively, while the power output element and the surge protection element are partially connected to each other and a predetermined electrode of the power output element and another end of the surge protection element are connected to each other, the first and second electrode wiring layers being formed separately from each other; and a third electrode wiring layer formed on the first and second electrode wiring layers, for connecting the first and second electrode wiring layers, wherein a characteristic of the power output element is previously evaluated using at least the first electrode wiring layer before the third electrode wiring layer is formed.

According to a third aspect of the present invention, there is provided a semiconductor device comprising:

a power MOSFET having a gate, a source, and a drain and formed on a semiconductor substrate;

a Zener diode having an anode and a cathode and formed adjacent to the power MOSFET on the semiconductor substrate;

a plurality of first metal wiring layers for connecting the power MOSFET and the zener diode to each other, except between the gate of the power MOSFET and the cathode of the Zener diode;

a second metal wiring layer for connecting the gate of the power MOSFET and the cathode of the Zener diode, wherein a screening voltage, which is applied to the gate of the power MOSFET before the second metal wiring layer is formed, is prevented from being applied to the Zener diode as an overvoltage.

According to a fourth aspect of the present invention, there is provided a method for manufacturing a semiconductor device, comprising the steps of:

forming a power MOSFET having a gate, a source, and a drain and a Zener diode having an anode and a cathode on a semiconductor substrate so as to be adjacent to each other;

connecting the power MOSFET and the Zener diode to each other by a plurality of first metal wiring layers, except between the gate of the power MOSFET and the cathode of the Zener diode;

performing a screening by applying a predetermined voltage to the gate of the power MOSFET; and connecting the gate of the power MOSFET and the cathode of the Zener diode by a second metal wiring layer after the screening step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG, 5 is a graph showing a relationship between a temperature and an estimated lifetime of a gate oxide film for each voltage to be used,

DETAILED DESCRIPTION OF THE PREFERRED EMBODIMENT

An embodiment of the present invention will now be described in detail, with reference to FIGS. 1A, 1B, 2A, and 2B. Let us suppose in this embodiment that the connection of elements and circuit blocks is performed by metal wiring using aluminum electrodes.

Figure 1A:
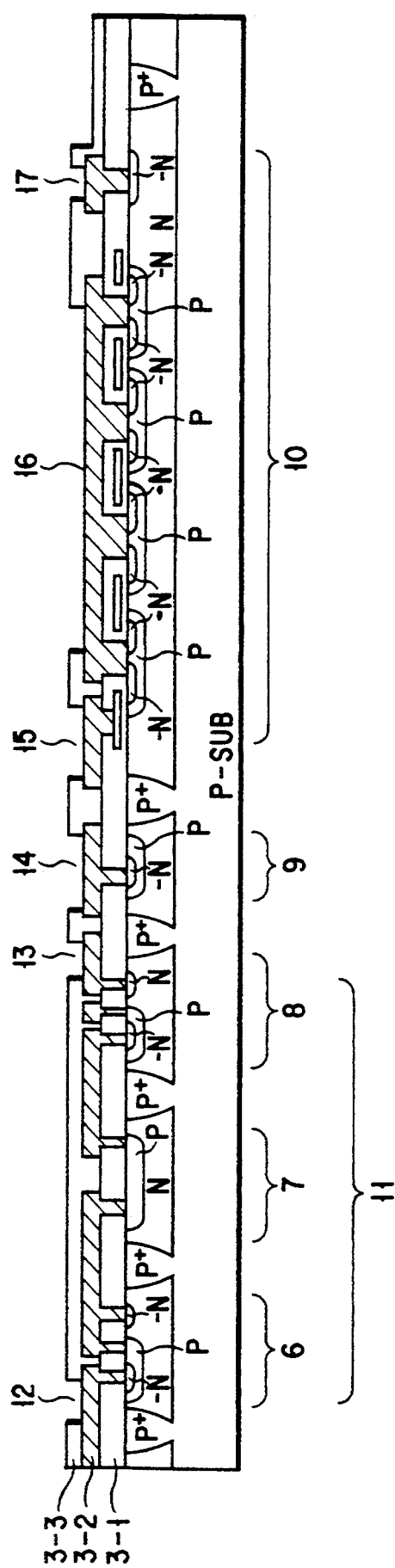
FIGS. 1A and 1B are a cross-sectional view and a block diagram of a semiconductor device in the intermediate manufacturing process according to one embodiment of the present invention.

As shown in FIG. 1A, small signal elements 6 and 8 of small signal NPN transistors and a resistor 7, which serve as a control circuit block 11, a Zener diode 9 serving as a surge protection element, and a power MOSFET 10 serving as a power output element, are formed on one chip of a P-type semiconductor substrate P-Sub by a well-known technique, and surfaces of these elements are protected by an oxide film 3-1 formed thereon.

Next, contact holes are formed in the oxide film 3-1, and an aluminum electrode 3-2 is formed by evaporation as a first metal wiring layer. The elements are then connected to one another by the etching technique. The small signal elements 6 and 8 and the resistor 7 are connected to constitute a control circuit block 11.

Figure 1B:
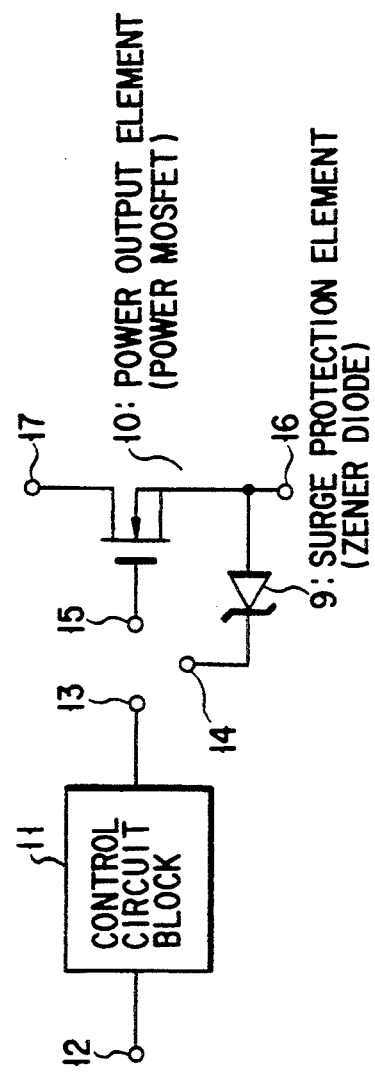

While the anode of the Zener diode 9 and the source of the power MOSFET 10 are connected to each other as shown in FIG. 1B, no elements are connected between the gate of the former and the cathode of the latter.

Then, an insulation film 3-3 is formed, and openings 12-17 are formed therein as chip screening pads.

By doing so, a semiconductor device having the circuit arrangement shown in FIG. 1B is achieved in the intermediate manufacturing process. When the first metal wiring layer is formed, the Zener diode 9 is not virtually connected between the gate and source of the power MOSFET 10.

In this state, element evaluation and chip screening are performed by a well-known die sorter.

More specifically, a probe of a die sorter (not shown) is applied to the bonding pads 12 and 13 to evaluate the control circuit block 11.

Similarly, the probe is applied to the bonding pads 14 and 16 to evaluate the Zener diode 9, and the probe is applied to the bonding pads 15, 16 and 17 to evaluate the power MOSFET 10 (including screening of a gate film).

Figure 2A:
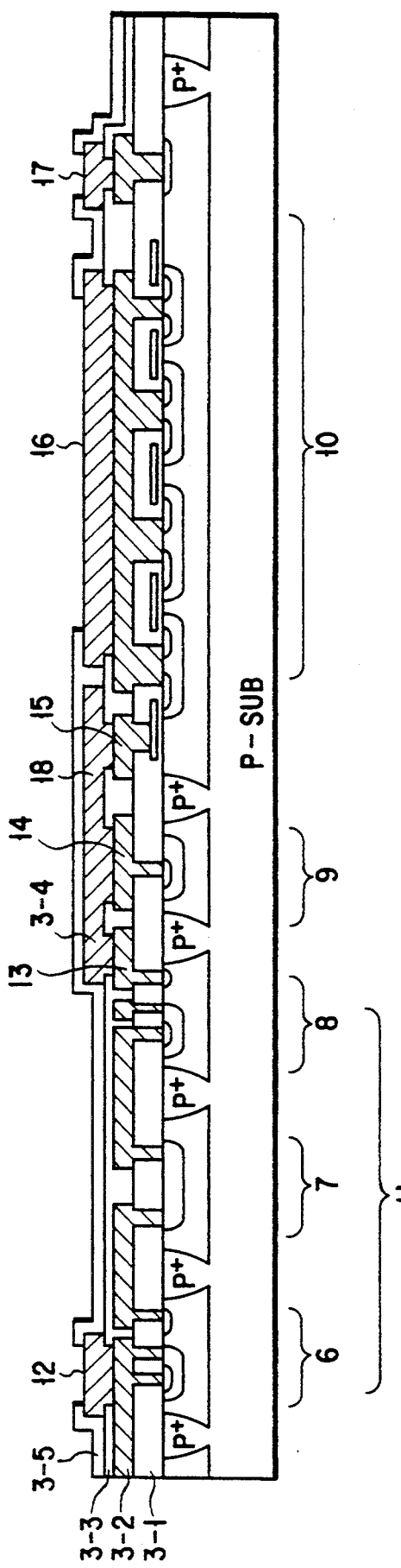
FIGS. 2A and 2B are a cross-sectional view and a block diagram of a finished semiconductor device according to one embodiment of the present invention.
Figure 3:
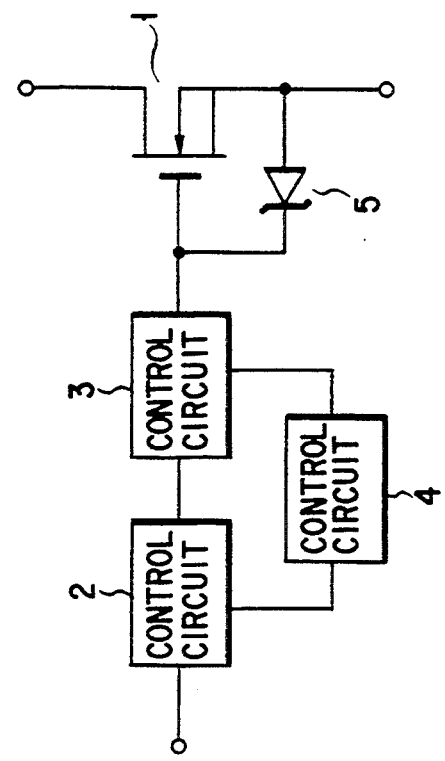
FIG. 3 is a block diagram of a conventional monolithic semiconductor device.
Figure 2B:
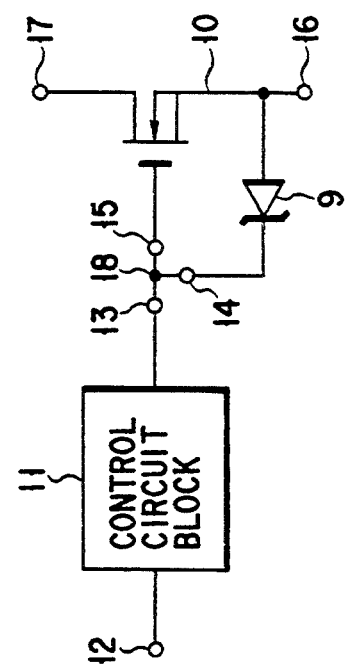
Figure 4:
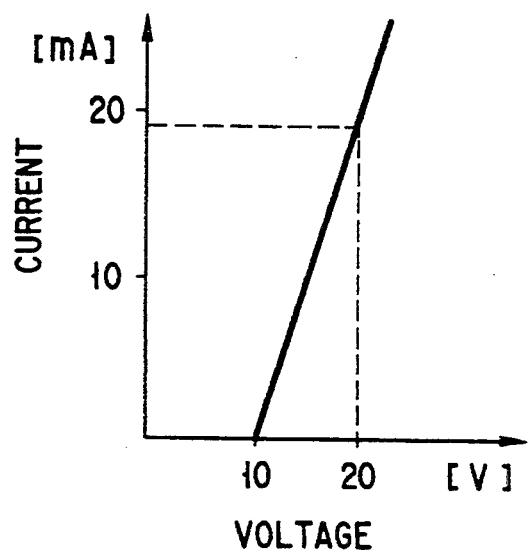
FIG. 4 is a graph showing a characteristic of a Zener diode.
Figure 5:
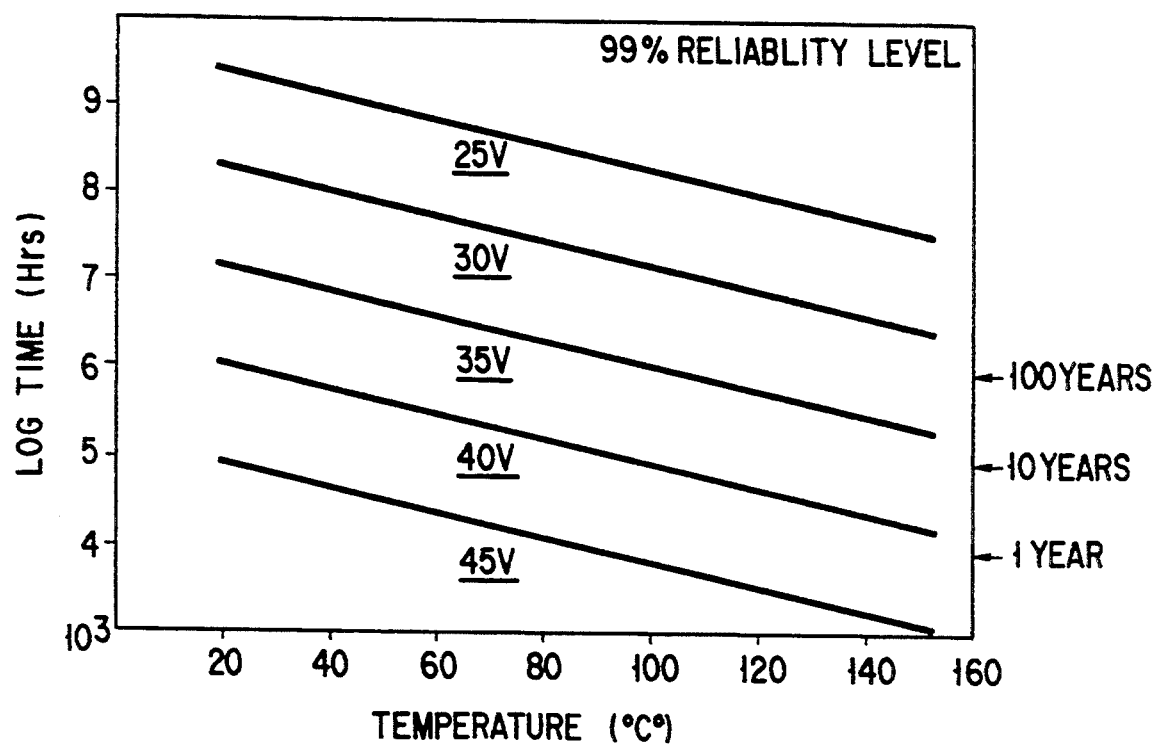

If the chip is judged as defect-free by the above evaluation, as shown in FIG. 2A, the control circuit block 11, Zener diode 9, and power MOSFET 10 are connected to one another by an aluminum electrode 3-4 (18). An insulation film 3-5 is then formed, and openings 12, 16 and 17 are formed as bonding pads, thereby obtaining a finished semiconductor functional device as shown in FIG. 2B.

In FIGS. 1A, 1B, 2A, and 2B, reference numerals 12 and 13 indicate an input terminal and an output terminal of the control circuit block 11, respectively, numeral 14 denotes a cathode of the Zener diode 9, and numerals 15, 16, and 17 show a gate electrode, a source electrode, and a drain electrode of the power MOSFET 10, respectively.

More specifically, as shown in FIGS. 1A, 1B, 2A, and 2B, the semiconductor device according to the present invention comprises: at least one power output element 10 made of an insulated gate semiconductor element, a circuit element block 11 for controlling the power output element 10 and a surge protection element 9 for an input electrode of the power output element 10, the circuit element block 11, the power output element 10, and the surge protection element 9 being formed on a single semiconductor substrate;

first, second and third electrode wiring layers 13, 14, and 15 connected to an output terminal 13 of the circuit element block 11, one end 14 of the surge protection element 9, and the input electrode 15 of the power output element 10, respectively, while the power output element 10, the surge protection element 9, and the circuit element block 11 are discretely connected to one another and a predetermined electrode of the power output element 10 is connected to another end of the surge protection element 9, the first, second and third electrode wiring layers being formed separately from one another;

a fourth electrode wiring layer 18 formed on the first, second and third electrode wiring layers 13, 14, and 15 for connecting the first, second and third electrode wiring layers 13, 14, and 15 to each other, wherein a characteristic of the power output element 10 is previously evaluated using at least the third electrode wiring layer 15 before the fourth electrode wiring layer 18 is formed.

According to the present invention described above in detail, the characteristics of output elements (e.g., power MOSFET) and circuit blocks can sufficiently be evaluated before they are connected to serve as a single function device, which was difficult in the conventional semiconductor device. Therefore, the reliability of the entire semiconductor device can be enhanced.

More specifically, in the present invention, since a protection element is connected between the gate and source of the power MOSFET not when the first metal wiring layer is formed but when the second metal wiring layer is formed, screening of a gate film of the power MOSFET can be performed, without applying an overvoltage to the protection element.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   at least one power output element made of an insulated gate semiconductor element, and a surge protection element for an input electrode of said power output element each formed on a semiconductor substrate;
   first and second electrode wiring layers connected to one region of the surge protection element, and the input electrode of the power output element, respectively, and a predetermined electrode of said power output element and another region of said surge protection element are connected to each other, said first and second electrode wiring layers being formed separately from each other; and
   a third electrode wiring layer formed on said first and second electrode wiring layers, for connecting said first and second electrode wiring layers,
   wherein at least a screening characteristics of the input electrode of said power output element is previously evaluated using at least said second electrode wiring layer before said third electrode wiring layer is formed.

2. The semiconductor device according to claim 1, wherein said power output element is a power MOSFET, and the surge protection element is a Zener diode.

3. The semiconductor device according to claim 2, wherein a pad for applying a gate withstand voltage measuring voltage of said power MOSFET is formed at said second electrode wiring layer which is formed at the input electrode of said power output element.

4. The semiconductor device according to claim 3, wherein said third electrode wiring layer is formed after the characteristic of said power MOSFET is evaluated by applying the voltage to said pad.

5. A semiconductor device comprising:
   a power MOSFET having a gate, a source, and a drain and formed on a semiconductor substrate;
   a Zener diode having an anode and a cathode and formed adjacent to said power MOSFET on the semiconductor substrate;
   first and second metal wiring layers connected to the cathode of the Zener diode, and the gate of the power MOSFET, respectively, and the source of the power MOSFET and the anode of the Zener diode being connected to each other the first and second metal wiring layers being formed separately from each other;
   a third metal wiring layer formed on said first and second metal wiring layers, for connecting said first and second metal wiring layers,
   wherein a screening voltage, which is applied to said second metal wiring layer before said third metal wiring layer is formed, is prevented from being applied to said Zener diode as an overvoltage.

6. A semiconductor device comprising:
   at least one power output element made of an insulated gate semiconductor element, a surge protection element for an input electrode of the power output element, and a circuit element block for controlling the power output element, the power output element the surge protection element, and circuit element block being formed on a single semiconductor substrate;
   first, second and third electrode wiring layers connected to an output terminal of the circuit element block, one region of the surge protection element, and the input electrode of the power output element, respectively, and a predetermined electrode of the power output element is connected to another region of the surge protection element, said first, second and third electrode wiring layers being formed separately from one another;
   a fourth electrode wiring layer formed on said first, second and third electrode wiring layers, for connecting said first, second and third electrode wiring layers to each other,
wherein at least a screening characteristic of the input electrode of said power output element is previously evaluated using at least said third electrode wiring layer before said fourth electrode wiring is formed.

7. The semiconductor device according to claim 6, wherein said power output element is a power MOSFET, and the surge protection element is a Zener diode.

8. The semiconductor device according to claim 7, wherein a pad for applying a gate withstand voltage measuring voltage of said power MOSFET is formed at said third electrode wiring layer which is formed at the input electrode of said power output element.

9. The semiconductor device according to claim 8, wherein said fourth electrode wiring layer is formed after the characteristic of said power MOSFET is evaluated by applying the gate withstand voltage measuring voltage to said pad.

* * * * *